US011139679B2

(12) United States Patent
Sato et al.

(10) Patent No.: US 11,139,679 B2
(45) Date of Patent: Oct. 5, 2021

(54) AUXILIARY POWER SOURCE DEVICE

(71) Applicants: JTEKT CORPORATION, Osaka (JP); TOYOTA JIDOSHA KABUSHIKI KAISHA, Toyota (JP)

(72) Inventors: Fumihiko Sato, Kashiwara (JP); Masataka Okuda, Toyota (JP); Toshiyuki Mikida, Anpachi-gun (JP); Hiroaki Hanzawa, Toyota (JP)

(73) Assignees: JTEKT CORPORATION, Osaka (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/884,228

(22) Filed: May 27, 2020

(65) Prior Publication Data
US 2020/0381936 A1 Dec. 3, 2020

(30) Foreign Application Priority Data
May 29, 2019 (JP) .............................. JP2019-100525

(51) Int. Cl.
H02J 9/06 (2006.01)
B62D 5/04 (2006.01)

(52) U.S. Cl.
CPC .............. *H02J 9/06* (2013.01); *B62D 5/0409* (2013.01); *B62D 5/0484* (2013.01)

(58) Field of Classification Search
USPC ......................................... 307/64, 9.1, 10.1
See application file for complete search history.

(56) References Cited

U.S. PATENT DOCUMENTS

| 4,118,688 A | 10/1978 | Glennon |
| 4,325,251 A | 4/1982 | Kanegae |
| 2008/0150483 A1* | 6/2008 | Morita ..................... H02J 9/061 320/122 |
| 2015/0205314 A1 | 7/2015 | Hayashi et al. |
| 2019/0074714 A1 | 3/2019 | Huck et al. |
| 2019/0149063 A1* | 5/2019 | Onda ...................... H02M 1/32 361/30 |

FOREIGN PATENT DOCUMENTS

| JP | 2015-136229 A | 7/2015 |
| JP | 2018-105420 A | 7/2018 |

OTHER PUBLICATIONS

Oct. 8, 2020 Search Report issued in European Application No. 20176811.6.

* cited by examiner

*Primary Examiner* — Toan T Vu
*Assistant Examiner* — Xuan Ly
(74) *Attorney, Agent, or Firm* — Oliff PLC

(57) ABSTRACT

An auxiliary power source device includes a main power source-side path, an auxiliary power source-side path, a power source control circuit, an analog determination circuit that is provided separately from the power source control circuit, and a power source switching circuit. The power source control circuit controls switching between a conduction state and an interruption state on the main power source-side path and the auxiliary power source-side path. The analog determination circuit determines an occurrence of abnormality in the main power source and generates a switching signal when the occurrence of the abnormality in the main power source is determined. The power source switching circuit switches a power source for supplying power to a power supply target, from the main power source to the auxiliary power source.

6 Claims, 5 Drawing Sheets

AUXILIARY POWER SOURCE DEVICE

CROSS-REFERENCE TO RELATED APPLICATION

This application claims priority to Japanese Patent Application No. 2019-100525 filed on May 29, 2019, incorporated herein by reference in its entirety.

BACKGROUND

1. Technical Field

The disclosure relates to an auxiliary power source device.

2. Description of Related Art

Japanese Unexamined Patent Application Publication No. 2015-136229 (JP 2015-136229 A) discloses a semiconductor integrated circuit that controls an output of power to a load. The semiconductor integrated circuit takes in a temperature measurement result being an analog signal and converts the temperature measurement result into a digital signal. The semiconductor integrated circuit switches the output of the power to the load between a non-stabilized power source and a stabilized power source, based on the digital signal.

SUMMARY

In the semiconductor integrated circuit, the temperature measurement result is taken in as the analog signal, and the analog signal is converted into the digital signal. Switching determination between the non-stabilized power source and the stabilized power source is performed based on the digital signal obtained by the conversion. A digital signal indicating a determination result is converted into an analog signal, and switching the power source is performed in accordance with the analog signal. As a result, the steps required to switch the power source are complicated. For example, in a case where a short-circuit problem occurs in the power source, the voltage of the power output from the power source drops sharply. Thus, power output from the power supply to the load may be insufficient before switching the power supply is completed. The semiconductor integrated circuit disclosed in JP 2015-136229 A may be improved from a viewpoint of quickly switching the power source.

An aspect of the disclosure is an auxiliary power source device. The auxiliary power source device includes a main power source-side path, an auxiliary power source-side path, a power source control circuit, an analog determination circuit, and a power source switching circuit. The main power source-side path is a power supply path from a main power source to a power supply target. The auxiliary power source-side path is connected to the main power source-side path. The auxiliary power source-side path is a power supply path from the auxiliary power source to the power supply target. The auxiliary power source is connected to the power supply target through the auxiliary power source-side path. The power source control circuit is configured to control switching between a conduction state and an interruption state on the main power source-side path and to control switching between a conduction state and an interruption state on the auxiliary power source-side path. The analog determination circuit is provided separately from the power source control circuit. The analog determination circuit is configured to determine an occurrence of abnormality in the main power source with an analog signal indicating an output state of the main power source. The analog determination circuit is configured to generate a switching signal that is an analog signal indicating the occurrence of the abnormality in the main power source when the occurrence of the abnormality in the main power source is determined. The power source switching circuit is configured to switch a power source for supplying power to the power supply target, from the main power source to the auxiliary power source based on the switching signal generated by the analog determination circuit.

With the configuration, in switching the power source, a step in which the analog determination circuit determines the occurrence of the abnormality in the main power source with the analog signal indicating the output state of the main power source and generates the switching signal that is an analog signal indicating the determination result, and the power source switching circuit switches the power source in accordance with the switching signal may be performed. That is, the switching signal as the analog signal can be generated without performing a process of converting the switching signal from the analog signal indicating the output state of the main power source into a digital value. Thus, it is possible to simplify a step required for switching the power source in comparison to the step in a case where the switching signal is converted into a digital signal and then is used for determining switching of the power source. Therefore, even in a situation in which the voltage of the power output from the main power source drops sharply, it is possible to more quickly switch the power source for supplying power to the power supply target, from the main power source to the auxiliary power source.

In the auxiliary power source device, the analog determination circuit may include a comparison circuit to which a power source voltage signal as the analog signal indicating the output state of the main power source and an abnormality determination voltage signal depending on an abnormality determination voltage are input. The power source voltage signal may indicate a power source voltage of the main power source. The abnormality determination voltage may indicate that the abnormality occurs in the main power source. The comparison circuit may be configured to, in a case where a voltage of the power source voltage signal exceeds a voltage of the abnormality determination voltage signal, determine that the abnormality does not occur in the main power source and to generate the switching signal in which the main power source is set as a power source for supplying power to the power supply target. The comparison circuit may be configured to, in a case where the voltage of the power source voltage signal does not exceed the voltage of the abnormality determination voltage signal, determine that the abnormality occurs in the main power source and to generate the switching signal in which the auxiliary power source is set as the power source for supplying power to the power supply target.

With the above configuration, it is possible to provide a specific configuration of the analog determination circuit that generates the switching signal in accordance with the power source voltage signal without performing a process of converting the power source voltage signal as the analog signal indicating the output state of the main power source, into the digital value.

In the auxiliary power source device, the power source switching circuit may include a main power source-side switching circuit that is provided on the main power source-side path, an auxiliary power source-side switching circuit that is provided on the auxiliary power source-side path, a main power source-side voltage applying circuit, and an auxiliary power source-side voltage applying circuit. The main power source-side switching circuit may include first metal-oxide-semiconductor field-effect-transistors that perform switching between the conduction state and the interruption state. The auxiliary power source-side switching circuit may include second metal-oxide-semiconductor field-effect-transistors that perform switching between the conduction state and the interruption state. The main power source-side voltage applying circuit may be configured to apply a gate voltage for performing switching between the conduction state and the interruption state to a gate terminal of the main power source-side switching circuit. The auxiliary power source-side voltage applying circuit may be configured to apply a gate voltage for performing switching between the conduction state and the interruption state to a gate terminal of the auxiliary power source-side switching circuit. The power source control circuit and the comparison circuit may be configured to control the switching of the main power source-side switching circuit between the conduction state and the interruption state by outputting a control voltage signal to the main power source-side voltage applying circuit. The power source control circuit and the comparison circuit may be configured to control the switching of the auxiliary power source-side switching circuit between the conduction state and the interruption state by outputting a control voltage signal to the auxiliary power source-side voltage applying circuit. The comparison circuit may be configured to, in a case where the voltage of the power source voltage signal exceeds the voltage of the abnormality determination voltage signal, output a control voltage signal for causing the main power source-side switching circuit to be in the conduction state, as the switching signal, to the main power source-side voltage applying circuit and output a control voltage signal for causing the auxiliary power source-side switching circuit to be in the interruption state, as the switching signal, to the auxiliary power source-side voltage applying circuit. The comparison circuit may be configured to, in a case where the voltage of the power source voltage signal does not exceed the voltage of the abnormality determination voltage signal, output a control voltage signal for causing the main power source-side switching circuit to turn into the interruption state, as the switching signal, to the main power source-side voltage applying circuit and output a control voltage signal for causing the auxiliary power source-side switching circuit to turn into the conduction state, as the switching signal, to the auxiliary power source-side voltage applying circuit.

With the above configuration, it is possible to provide a specific configuration of the power source switching circuit that switches the power source for supplying power to the power supply target, from the main power source to the auxiliary power source by inputting the control voltage signal as the analog signal output from the comparison circuit to the power source switching circuit.

In the auxiliary power source device, the analog determination circuit may include a pseudo operation circuit that causes pseudo abnormality to occur in the power source voltage signal input to the comparison circuit based on an input of a pseudo abnormality signal from the power source control circuit. The power source control circuit may be configured to, in a case where an operation of the analog determination circuit is checked, output the pseudo abnormality signal for causing pseudo abnormality to occur in the power source voltage signal input to the comparison circuit, to the pseudo operation circuit. The power source control circuit may be configured to, in a case where the comparison circuit generates the switching signal as a result of outputting the pseudo abnormality signal to the pseudo operation circuit, determine that the abnormality does not occur in the analog determination circuit. The power source control circuit may be configured to, in a case where the comparison circuit does not generate the switching signal regardless of the output of the pseudo abnormality signal to the pseudo operation circuit, determine that the abnormality occurs in the analog determination circuit.

With the above configuration, the power source control circuit can detect the occurrence of the abnormality in the analog determination circuit based on determination of whether or not the comparison circuit generates the switching signal by the output of the pseudo abnormality signal to the pseudo operation circuit. This is because, in a case where the abnormality occurs in the analog determination circuit, the switching signal is not generated even though the power source control circuit outputs the pseudo abnormality signal to the pseudo operation circuit. Thus, it is possible to recognize information regarding whether or not the abnormality occurs in the analog determination circuit, and thus to perform a countermeasure for the occurrence of the abnormality in the analog determination circuit. Since the analog determination circuit switches the power source in a state where it is checked that the abnormality does not occur in the analog determination circuit, it is possible to improve reliability of the auxiliary power source device.

In the auxiliary power source device, the power source control circuit may store an abnormality-determination-voltage threshold value for indicating that the abnormality occurs in the main power source, as a digital value. The power source control circuit may be configured to acquire the power source voltage signal and to convert the acquired power source voltage signal into a power source voltage value that is a digital value. The power source control circuit may be configured to, in a case where the power source voltage value exceeds the abnormality-determination-voltage threshold value, output an analog signal for setting the main power source as the power source for supplying power to the power supply target, to the power source switching circuit. The power source control circuit may be configured to, in a case where the power source voltage value does not exceed the abnormality-determination-voltage threshold value, output an analog signal for setting the auxiliary power source as the power source for supplying power to the power supply target, to the power source switching circuit.

With the above configuration, not only the analog determination circuit, but also the power source control circuit can determine whether the abnormality occurs in the main power source. Thus, it is possible to more appropriately switch the power source in response to the occurrence of abnormality having a different form, than in a case where only either the analog determination circuit or the power source control circuit performs determination.

In the auxiliary power source device, the abnormality-determination-voltage threshold value may be set to have a potential that is higher than a voltage value obtained by converting the abnormality determination voltage signal into a digital value. As the abnormality of the main power source, various forms as follows are provided: a short-circuit problem of the main power source, in which the power source voltage value of the main power source drops sharply; an open problem of the main power source, in which the power source voltage value of the main power source drops slowly; and abnormality caused by deterioration of the main power source with time. In a situation in which the power source voltage value of the main power source drops slowly, it is assumed that a situation in which the power source voltage value of the main power source exceeds the voltage of the abnormality determination voltage signal, but does not exceed the abnormality-determination-voltage threshold value occurs before the power source voltage value of the main power source drops to become lower than the voltage of the abnormality determination voltage signal. In a situation in which the power source voltage value of the main power source drops sharply, it is assumed that a situation in which the power source voltage value of the main power source instantaneously drops to become lower than the voltage of the abnormality determination voltage signal occurs. Therefore, the abnormality-determination-voltage threshold value used when the power source control circuit determines whether the abnormality occurs in the main power source is set to have a potential that is higher than the voltage of the abnormality determination voltage signal used when the analog determination circuit capable of quick determination determines whether the abnormality occurs in the main power source. Thus, it is possible to distinguish a case where the occurrence of the abnormality in the main power source is determined based on determination that the power source voltage value of the main power source does not exceed the voltage of the abnormality determination voltage signal, from a case where the occurrence of the abnormality in the main power source is determined based on determination that the power source voltage value of the main power source exceeds the voltage of the abnormality determination voltage signal, but does not exceed the abnormality-determination-voltage threshold value. Accordingly, it is possible to recognize the form of the abnormality occurring in the main power source.

The auxiliary power source device in the present disclosure enables the power source to be switched quickly.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
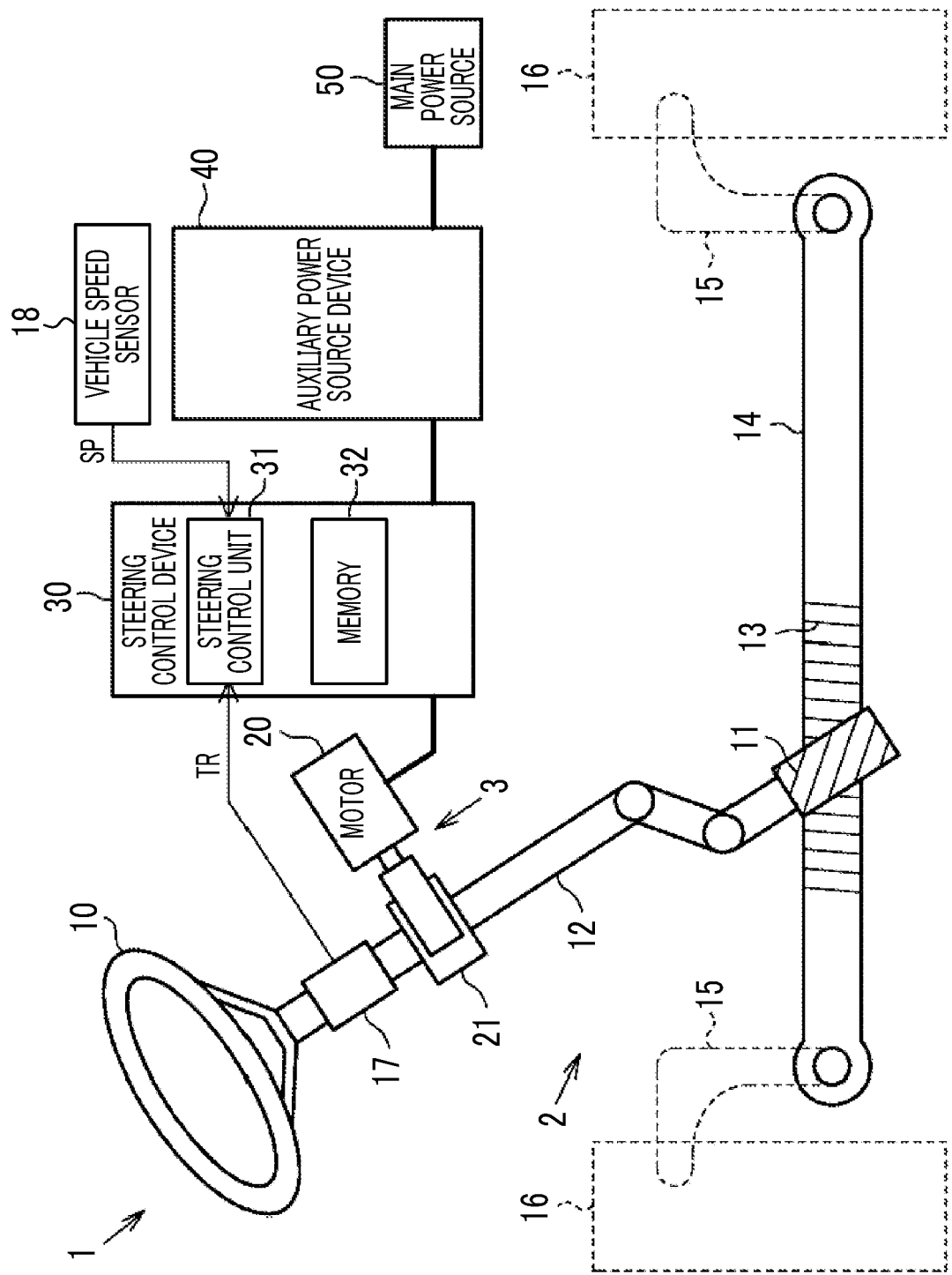
FIG. 1 is a schematic diagram illustrating a configuration of a steering device to which an auxiliary power source device is applied.

An embodiment in which an auxiliary power source device is applied to a steering device will be described. As illustrated in FIG. 1, a steering device 1 includes a steering mechanism 2, an assist mechanism 3, a steering control device 30, and an auxiliary power source device 40. The steering mechanism 2 steers a tire-wheel assembly 16 based on an operation of a steering wheel 10 of a driver. The assist mechanism 3 includes a motor 20 that assists the steering operation of the driver. The steering device 1 is a so-called electric power steering device that assists the steering operation of the driver by applying the motor torque of the motor 20 to the steering mechanism 2 as a steering assist force.

The steering mechanism 2 includes a steering shaft 12 and a rack shaft 14. A first end of the steering shaft 12 is fixed to the steering wheel 10, and a pinion gear 11 is formed at a second end of the steering shaft 12. The rack shaft 14 is formed with a rack gear 13 engaged with the pinion gear 11. The pinion gear 11 and the rack gear 13 constitute a rack-and-pinion mechanism. The rotational motion of the steering shaft 12 is converted into a reciprocating linear motion of the rack shaft 14 in an axial direction through the rack-and-pinion mechanism. The steering device 1 is mounted on the vehicle such that the axial direction of the rack shaft 14 is a vehicle width direction. The reciprocating linear motion of the rack shaft 14 is transferred to right and left tire-wheel assemblies 16 through tie rods 15 connected to both ends of the rack shaft 14, respectively, such that the steering angle of the tire-wheel assembly 16 changes, and a traveling direction of a vehicle is changed.

A torque sensor 17 that measures a steering torque TR applied to the steering shaft 12 by operating the steering wheel 10 is mounted on the steering shaft 12. The torque sensor 17 in the embodiment detects the amount of torsion of a torsion bar constituting a part of the steering shaft 12, and measures the steering torque TR based on the amount of torsion.

The assist mechanism 3 includes a motor 20 for assisting steering and a speed reducer 21. The motor 20 is connected to the speed reducer 21, and the speed reducer 21 is connected to the steering shaft 12. The speed reducer 21 reduces the rotation of the motor 20 and transfers the reduced rotation force to the steering shaft 12. As the motor 20 in the embodiment, a three-phase brushless motor is employed. A worm gear mechanism is employed as the speed reducer 21 in the embodiment.

The steering control device 30 includes an inverter that is a known circuit including two switching elements for each phase (U-phase, V-phase, and W-phase) of the motor 20. When the steering device 1 is mounted on a vehicle, the auxiliary power source device 40 is connected to the main power source 50 mounted on the vehicle, and the steering control device 30 is connected to the auxiliary power source device 40. The auxiliary power source device 40 is provided between the main power source 50 and the steering control device 30 as a power supply target. The steering control device 30 assists a steering operation of a driver by controlling the operation of the motor 20 with supplying power from the main power source 50. The steering control device 30 includes a steering control unit 31 and a memory 32. The steering control unit 31 performs various types of arithmetic processing of calculating control amounts and the like for controlling the operation of the motor 20. The memory 32 stores programs and data for the various types of arithmetic processing. The above-described torque sensor 17 and a vehicle speed sensor 18 are connected to the steering control unit 31. The vehicle speed sensor 18 detects a traveling speed SP of the vehicle. When the steering control unit controls the steering assist force, the steering control unit 31 determines the steering assist force corresponding to a target steering assist force that is a target value of the steering assist force, based on the steering torque TR and the traveling speed SP. The steering control unit 31 controls the operation of the motor 20 through the control of the inverter to generate a steering assist force corresponding to the target steering assist force.

Figure 2:
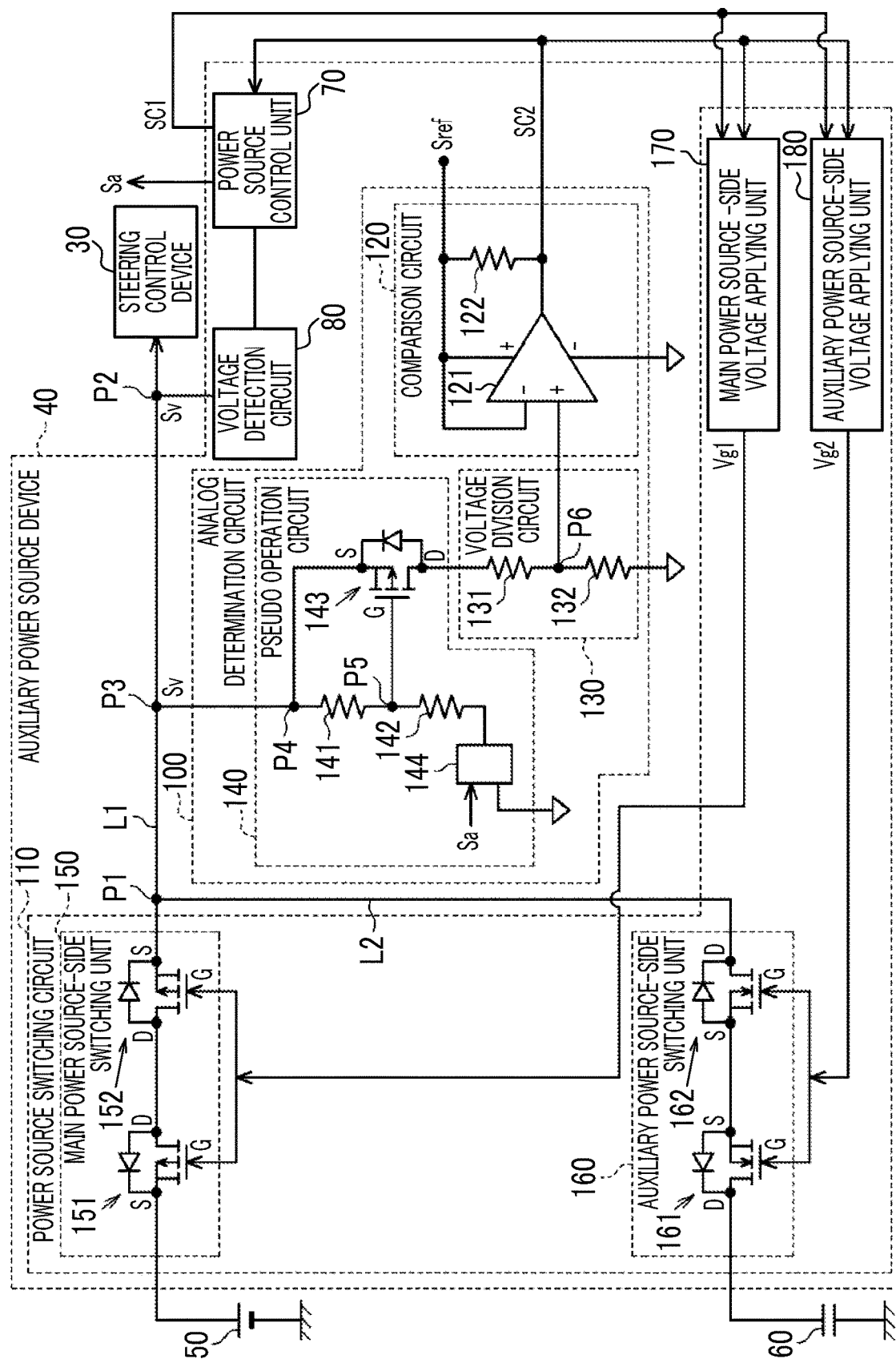
FIG. 2 is a diagram illustrating an electrical configuration of the auxiliary power source device.

The configuration of the auxiliary power source device 40 will be described. As illustrated in FIG. 2, the auxiliary power source device 40 includes an auxiliary power source 60, a power source control unit 70, a voltage detection circuit 80, an analog determination circuit 100, and a power source switching circuit 110.

A main power source-side power supply path L1 and an auxiliary power source-side power supply path L2 are provided in the auxiliary power source device 40. The main power source-side power supply path L1 is provided as a power supply path from the main power source 50 to the steering control device 30 as a power supply target. The auxiliary power source-side power supply path L2 is connected to the main power source-side power supply path L1 and is used as a power supply path from the auxiliary power source 60 to the steering control device 30. The auxiliary power source-side power supply path L2 is connected to a connection point P1 on the main power source-side power supply path L1.

The auxiliary power source 60 is connected to the steering control device 30 through the auxiliary power source-side power supply path L2. The auxiliary power source 60 is capable of charging and discharging electric charges. As the auxiliary power source 60, for example, a lithium ion capacitor is employed.

The power source switching circuit 110 includes a main power source-side switching unit 150, an auxiliary power source-side switching unit 160, a main power source-side voltage applying unit 170, and an auxiliary power source-side voltage applying unit 180. The main power source-side switching unit 150 is provided between the main power source 50 and the connection point P1 on the main power source-side power supply path L1. The main power source-side switching unit 150 includes a first MOSFET (metal-oxide-semiconductor field-effect-transistor) 151 and a second MOSFET 152. Each of the first MOSFET 151 and the second MOSFET 152 is a P-channel MOSFET including a source terminal associated with a P-type semiconductor layer, a drain terminal associated with a P-type semiconductor layer, and a gate terminal associated with an N-type semiconductor layer. In FIG. 2, the source terminal is indicated by "S", the drain terminal is indicated by "D", and the gate terminal is indicated by "G".

The first MOSFET 151 has a source terminal connected to a high-potential side of the main power source 50 and a drain terminal connected to the drain terminal of the second MOSFET 152. The second MOSFET 152 has the drain terminal connected to the drain terminal of the first MOSFET 151 and a source terminal connected to the steering control device 30 through the main power source-side power supply path L1. The gate terminal of the first MOSFET 151 and the gate terminal of the second MOSFET 152 are connected to the main power source-side voltage applying unit 170. In the main power source-side switching unit 150, switching between a conduction state and an interruption state is performed by the first MOSFET 151 and the second MOSFET 152. In the conduction state, power supply is performed through the main power source-side power supply path L1 between the main power source 50 and the steering control device 30. In the interruption state, the power supply is interrupted.

The auxiliary power source-side switching unit 160 is provided on the auxiliary power source-side power supply path L2. The auxiliary power source-side switching unit 160 includes a third MOSFET 161 and a fourth MOSFET 162. Each of the third MOSFET 161 and the fourth MOSFET 162 is an N-channel MOSFET including a source terminal associated with an N-type semiconductor layer, a drain terminal associated with an N-type semiconductor layer, and a gate terminal associated with a P-type semiconductor layer.

The third MOSFET 161 has a drain terminal connected to a high-potential side of the auxiliary power source 60 and a source terminal connected to a source terminal of the fourth MOSFET 162. The fourth MOSFET 162 has a drain terminal connected to the connection point P1 on the main power source-side power supply path L1 through the auxiliary power source-side power supply path L2. The gate terminal of the third MOSFET 161 and the gate terminal of the fourth MOSFET 162 are connected to the auxiliary power source-side voltage applying unit 180. In the auxiliary power source-side switching unit 160, switching between a conduction state and an interruption state is performed by the third MOSFET 161 and the fourth MOSFET 162. In the conduction state, power supply is performed through the auxiliary power source-side power supply path L2 between the auxiliary power source 60 and the steering control device 30. In the interruption state, the power supply is interrupted.

The voltage detection circuit 80 is connected to a connection point P2 between the connection point P1 and the steering control device 30 on the main power source-side power supply path L1. The power source control unit 70 is connected to the voltage detection circuit 80 and to the analog determination circuit 100. The power source control unit 70 is connected to the main power source-side voltage applying unit 170 and the auxiliary power source-side voltage applying unit 180.

The power source control unit 70 has a function of controlling switching between the conduction state and the interruption state on the main power source-side power supply path L1 and a function of controlling switching between the conduction state and the interruption state on the auxiliary power source-side power supply path L2. Although not illustrated, the power source control unit 70 controls the units of the auxiliary power source device 40 based on an input voltage of the main power source 50. The power source control unit 70 outputs a first control voltage signal SC1 for performing switching between the conduction state and the interruption state on the main power source-side power supply path L1, to the main power source-side voltage applying unit 170, and outputs a first control voltage signal SC1 for performing switching between the conduction state and the interruption state on the auxiliary power source-side power supply path L2, to the auxiliary power source-side voltage applying unit 180. The first control voltage signal SC1 is an analog signal including a high-level voltage signal and a low-level voltage signal.

In a case where the abnormality is determined not to occur in the main power source 50, the power source control unit 70 outputs the first control voltage signal SC1 for causing the first MOSFET 151 and the second MOSFET 152 on the main power source-side power supply path L1 to be in the conduction state, to the main power source-side voltage applying unit 170 such that the steering control device 30 is caused to perform a control related to application of the steering assist force based on the power supply from the main power source 50. In a case where the abnormality is determined not to occur in the main power source 50, the power source control unit 70 outputs the first control voltage signal SC1 for causing the third MOSFET 161 and the fourth MOSFET 162 on the auxiliary power source-side power supply path L2 to be in the interruption state, to the auxiliary power source-side voltage applying unit 180. In a case where the occurrence of the abnormality in the main power source 50 is determined, the power source control unit 70 outputs the first control voltage signal SC1 for causing the third MOSFET 161 and the fourth MOSFET 162 on the auxiliary power source-side power supply path L2 to turn into the conduction state, to the auxiliary power source-side voltage applying unit 180 such that the steering control device 30 is caused to perform a control related to application of the steering assist force based on the power supply from the auxiliary power source 60. In a case where the occurrence of the abnormality in the main power source 50 is determined, the power source control unit 70 outputs the first control voltage signal SC1 for causing the first MOSFET 151 and the second MOSFET 152 on the main power source-side power supply path L1 to turn into the interruption state, to the main power source-side voltage applying unit 170. The first control voltage signal SC1 output from the power source control unit 70 in a case where the abnormality is determined not to occur in the main power source 50 is a high-level signal having a potential that is higher than a potential of the first control voltage signal SC1 output from the power source control unit 70 in a case where the occurrence of the abnormality in the main power source 50 is determined.

In a case where the first control voltage signal SC1 for causing the first MOSFET 151 and the second MOSFET 152 on the main power source-side power supply path L1 to turn into the conduction state is input from the power source control unit 70, the main power source-side voltage applying unit 170 applies a gate voltage Vg1 to the gate terminal of the first MOSFET 151 and the gate terminal of the second MOSFET 152. The gate voltage Vg1 has a potential that is lower than the potential at the source terminal. In this case, the gate voltage Vg1 is set to a voltage value as large as an inversion layer is formed in the P-type semiconductor layer associated with the gate terminal. In a case where the first control voltage signal SC1 for causing the first MOSFET 151 and the second MOSFET 152 on the main power source-side power supply path L1 to turn into the interruption state is input from the power source control unit 70, the main power source-side voltage applying unit 170 applies the gate voltage Vg1 to the gate terminal of the first MOSFET 151 and the gate terminal of the second MOSFET 152 such that the potential at the source terminal is equal to the potential at the gate terminal. In this case, the gate voltage Vg1 is set to a voltage value as large as an inversion layer is not formed in the P-type semiconductor layer associated with the gate terminal.

In a case where the first control voltage signal SC1 for causing the third MOSFET 161 and the fourth MOSFET 162 on the auxiliary power source-side power supply path L2 to turn into the conduction state is input from the power source control unit 70, the auxiliary power source-side voltage applying unit 180 applies a gate voltage Vg2 to the gate terminal of the third MOSFET 161 and the gate terminal of the fourth MOSFET 162. The gate voltage Vg2 has a potential that is higher than the potential at the source terminal. In this case, the gate voltage Vg2 is set to a voltage value as large as an inversion layer is formed in the N-type semiconductor layer associated with the gate terminal. In a case where the first control voltage signal SC1 for causing the third MOSFET 161 and the fourth MOSFET 162 on the auxiliary power source-side power supply path L2 to turn into the interruption state is input from the power source control unit 70, the auxiliary power source-side voltage applying unit 180 applies a gate voltage Vg2 to the gate terminal of the third MOSFET 161 and the gate terminal of the fourth MOSFET 162 such that the potential at the source terminal is equal to the potential at the gate terminal. In this case, the gate voltage Vg2 is set to a voltage value as large as an inversion layer is not formed in the N-type semiconductor layer associated with the gate terminal.

The power source control unit 70 detects a power source voltage signal Sv indicating a voltage at the connection point P2 through the voltage detection circuit 80. For example, the voltage detection circuit 80 divides the voltage indicated by the power source voltage signal Sv at the connection point P2 through voltage division resistors, and outputs the divided voltage to the power source control unit 70. The power source control unit 70 converts the input divided voltage into a digital value, and recognizes a power source voltage value Vv of the main power source 50, that is indicated by the power source voltage signal Sv, from the digital value. The power source control unit 70 stores an abnormality-determination-voltage threshold value Vth indicating that abnormality has occurred in the main power source 50, as a digital value. The abnormality-determination-voltage threshold value Vth is set to a value as large as abnormality is determined to occur in the main power source 50 when the power source voltage value Vv of the main power source 50 becomes smaller than the abnormality-determination-voltage threshold value Vth. In a case where a state where the power source voltage value Vv of the main power source 50 does not exceed the abnormality-determination-voltage threshold value Vth does not continue for a predetermined period, the power source control unit 70 generates the first control voltage signal SC1 of a high level, which is for setting the main power source 50 as the power source that supplies power to the steering control device 30 as the power supply target. In a case where the state where the power source voltage value Vv of the main power source 50 does not exceed the abnormality-determination-voltage threshold value Vth continues for the predetermined period, the power source control unit 70 generates the first control voltage signal SC1 of a low level, which is for setting the auxiliary power source 60 as the power source that supplies power to the steering control device 30 as the power supply target. The predetermined period is set to a time as large as it is considered that a state where the power source voltage value Vv of the main power source 50 does not exceed the abnormality-determination-voltage threshold value Vth is not a state that temporarily occurs by noise or the like.

The analog determination circuit 100 is provided separately from the power source control unit 70, and performs the determination of whether the abnormality occurs in the main power source 50 separately from the power source control unit 70. The analog determination circuit 100 is a circuit that determines the abnormality in the main power source 50 with the power source voltage signal Sv without converting the power source voltage signal Sv indicating the power source voltage value Vv of the main power source 50 into a digital value, and generates an analog signal indicating the occurrence of the abnormality in the main power source 50 when the analog determination circuit determines the occurrence of the abnormality in the main power source 50.

The analog determination circuit 100 includes a comparison circuit 120, a voltage division circuit 130, and a pseudo operation circuit 140.

The pseudo operation circuit 140 is connected to a connection point P3 between the connection point P1 and the connection point P2 on the main power source side-power supply path L1. A power source voltage signal Sv indicating a voltage at the connection point P3 is identical to the power source voltage signal Sv indicating the voltage at the connection point P2. The pseudo operation circuit 140 is a circuit that causes pseudo abnormality to occur in the power source voltage signal Sv output to the comparison circuit 120 described later. The pseudo operation circuit 140 includes a voltage division resistor 141, a voltage division resistor 142, a fifth MOSFET 143, and a digital transistor 144.

The voltage division resistor 141 has a first end connected to the connection point P3 on the main power source-side power supply path L1 and a second end connected to the voltage division resistor 142. The voltage division resistor 142 has a first end connected to the voltage division resistor 141 and a second end connected to a collector terminal of the digital transistor 144.

The fifth MOSFET 143 is a P-channel MOSFET including a source terminal associated with a P-type semiconductor layer, a drain terminal associated with a P-type semiconductor layer, and a gate terminal associated with an N-type semiconductor layer. The fifth MOSFET 143 has a source terminal connected to a connection point P4 between the connection point P3 and the voltage division resistor 141, and a drain terminal connected to the voltage division circuit 130. The gate terminal of the fifth MOSFET 143 is connected to a connection point P5 between the voltage division resistors 141 and 142. The fifth MOSFET 143 performs switching between the conduction state in which the power supply is performed in accordance with the power source voltage signal Sv and the interruption state in which the power supply is interrupted, between the connection point P3 and the voltage division circuit 130.

The digital transistor 144 has a built-in bias resistor. The base terminal of the digital transistor 144 is connected to the built-in bias resistor, and the bias resistor is connected to the power source control unit 70. The emitter terminal of the digital transistor 144 is connected to the ground, and the collector terminal is connected to the voltage division resistor 142. In a case where the operation of the analog determination circuit 100 is checked during an initial check at the start of the vehicle, the power source control unit 70 outputs a pseudo abnormality signal Sa for causing pseudo abnormality to occur in the power source voltage signal Sv input to the comparison circuit 120, to the digital transistor 144.

In a case where the pseudo abnormality signal Sa is input from the power source control unit 70, the digital transistor 144 turns off such that flowing of a current between the collector terminal and the emitter terminal is not possible. Thus, the source terminal and the gate terminal of the fifth MOSFET 143 have the equal potential, and the fifth MOSFET 143 turns into the interruption state. In this case, the gate voltage is set to a voltage value as large as an inversion layer is not formed in the P-type semiconductor layer associated with the gate terminal. In a case where the pseudo abnormality signal Sa is not input from the power source control unit 70, the digital transistor 144 turns on such that flowing of a current between the collector terminal and the emitter terminal is possible. Thus, the gate voltage having a potential that is lower than the potential at the source terminal is applied to the gate terminal of the fifth MOSFET 143, and the fifth MOSFET 143 turns into the conduction state in which flowing of a current between the source terminal and the drain terminal is possible. In this case, the gate voltage is set to a voltage value as large as an inversion layer is formed in the P-type semiconductor layer associated with the gate terminal.

The voltage division circuit 130 includes a voltage division resistor 131 and a voltage division resistor 132. The voltage division resistor 131 has a first end connected to the drain terminal of the fifth MOSFET 143 and a second end connected to the voltage division resistor 132. The voltage division resistor 132 has a first end connected to the voltage division resistor 131 and a second end connected to the ground. A connection point P6 between the voltage division resistors 131 and 132 is connected to the comparison circuit 120.

The comparison circuit 120 includes a comparator 121 and a pull-up resistor 122. The positive input terminal of the comparator 121 is connected to the connection point P6 between the voltage division resistors 131 and 132 in the voltage division circuit 130. Thus, the power source voltage signal Sv divided by the voltage division circuit 130 is input to the positive input terminal of the comparator 121. The negative input terminal of the comparator 121 is connected to an abnormality-determination voltage signal generation unit. The abnormality-determination voltage signal generation unit generates an abnormality determination voltage signal Sref that is a voltage indicating that the abnormality has occurred in the main power source 50, and outputs the abnormality determination voltage signal Sref to the negative input terminal of the comparator 121. The resistance value of the voltage division resistor 131 and the resistance value of the voltage division resistor 132 constituting the voltage division circuit 130 are adjusted such that the divided power source voltage signal Sv is allowed to be compared with the abnormality determination voltage signal Sref. The abnormality determination voltage signal Sref is set to a value as large as abnormality is determined to occur in the main power source 50 when the divided voltage of the power source voltage signal Sv becomes smaller than the voltage of the abnormality determination voltage signal Sref. The positive power source terminal of the comparator 121 is connected to the abnormality-determination voltage signal generation unit that generates the abnormality determination voltage signal Sref. The abnormality-determination voltage signal generation unit is a circuit that generates a constant voltage. The negative power source terminal of the comparator 121 is connected to the ground. The output terminal of the comparator 121 is connected to the power source control unit 70, and is connected to the main power source-side voltage applying unit 170 and the auxiliary power source-side voltage applying unit 180. The voltage value of the abnormality determination voltage signal Sref is set to a potential lower than the potential of the abnormality-determination-voltage threshold value Vth in a case where the abnormality determination voltage signal Sref is converted into a digital value in consideration of the voltage division by the voltage division circuit 130.

The pull-up resistor 122 is provided between the abnormality-determination voltage signal generation unit and the output terminal of the comparator 121. The pull-up resistor 122 is provided to stabilize a second control voltage signal SC2 output from the output terminal of the comparator 121. The second control voltage signal SC2 corresponds to the switching signal described in the claims.

The comparator 121 compares the divided voltage of the power source voltage signal Sv input from the positive input terminal with the voltage of the abnormality determination voltage signal Sref input from the negative input terminal. In a case where the divided voltage of the power source voltage signal Sv exceeds the voltage of the abnormality determination voltage signal Sref, the comparator 121 determines that there is no abnormality in the main power source 50, and outputs the second control voltage signal SC2 of a high level, which is for causing the main power source 50 as the power source that supplies power to the steering control device 30, from the output terminal. In a case where the divided voltage of the power source voltage signal Sv does not exceed the voltage of the abnormality determination voltage signal Sref, the comparator 121 determines that the abnormality has occurred in the main power source 50, and outputs the second control voltage signal SC2 of a low level, which is for causing the auxiliary power source 60 as the power source that supplies power to the steering control device 30, from the output terminal.

In a case where the second control voltage signal SC2 for causing the first MOSFET 151 and the second MOSFET 152 on the main power source-side power supply path L1 to turn into the conduction state is input from the comparison circuit 120, the main power source-side voltage applying unit 170 applies a gate voltage Vg1 having a potential that is lower than the potential at the source terminal, to the gate terminal of the first MOSFET 151 and the gate terminal of the second MOSFET 152. In this case, the gate voltage Vg1 is set to a voltage value as large as an inversion layer is formed in the P-type semiconductor layer associated with the gate terminal. In a case where the second control voltage signal SC2 for causing the first MOSFET 151 and the second MOSFET 152 on the main power source-side power supply path L1 to turn into the interruption state is input from the comparison circuit 120, the main power source-side voltage applying unit 170 applies the gate voltage Vg1 to the gate terminal of the first MOSFET 151 and the gate terminal of the second MOSFET 152 such that the potential at the source terminal is equal to the potential at the gate terminal. In this case, the gate voltage Vg1 is set to a voltage value as large as an inversion layer is not formed in the P-type semiconductor layer associated with the gate terminal.

In a case where the second control voltage signal SC2 for causing the third MOSFET 161 and the fourth MOSFET 162 on the auxiliary power source-side power supply path L2 to turn into the conduction state is input from the comparison circuit 120, the auxiliary power source-side voltage applying unit 180 applies a gate voltage Vg2 having a potential that is higher than the potential at the source terminal, to the gate terminal of the third MOSFET 161 and the gate terminal of the fourth MOSFET 162. In this case, the gate voltage Vg2 is set to a voltage value as large as an inversion layer is formed in the N-type semiconductor layer associated with the gate terminal. In a case where the second control voltage signal SC2 for causing the third MOSFET 161 and the fourth MOSFET 162 on the auxiliary power source-side power supply path L2 to turn into the interruption state is input from the comparison circuit 120, the auxiliary power source-side voltage applying unit 180 applies the gate voltage Vg2 to the gate terminal of the third MOSFET 161 and the gate terminal of the fourth MOSFET 162 such that the potential at the source terminal is equal to the potential at the gate terminal. In this case, the gate voltage Vg2 is set to a voltage value as large as an inversion layer is not formed in the N-type semiconductor layer associated with the gate terminal.

The operation in the embodiment will be described.

In a case where the abnormality does not occur in the main power source 50, the power source voltage value Vv indicated by the power source voltage signal Sv of the main power source 50 exceeds the abnormality-determination-voltage threshold value Vth, and the divided voltage of the power source voltage signal Sv exceeds the voltage of the abnormality determination voltage signal Sref. The power source control unit 70 determines that the situation in which the power source voltage value Vv of the main power source 50, which is recognized using the voltage detection circuit 80 does not exceed the abnormality-determination-voltage threshold value Vth does not continue for a predetermined period, and outputs the first control voltage signal SC1 of a high level. Since the pseudo abnormality signal Sa is not input from the power source control unit 70, the pseudo operation circuit 140 outputs the power source voltage signal Sv input from the connection point P3 to the voltage division circuit 130 through the source terminal and the drain terminal of the fifth MOSFET 143. The voltage division circuit 130 outputs the power source voltage signal Sv divided by the voltage division resistors 131 and 132 to the comparison circuit 120. Since the voltage of the power source voltage signal Sv divided by the voltage division circuit 130 exceeds the voltage of the abnormality determination voltage signal Sref, the comparison circuit 120 determines that there is no abnormality in the main power source 50 and outputs the second control voltage signal SC2 of a high level from the output terminal. The first control voltage signal SC1 of a high level and the second control voltage signal SC2 of a high level are input to the main power source-side voltage applying unit 170, and the gate voltage Vg1 having a potential that is lower than the potential at the source terminal is applied to the gate terminal of the first MOSFET 151 and the gate terminal of the second MOSFET 152. The first control voltage signal SC1 of a high level and the second control voltage signal SC2 of a high level are input to the auxiliary power source-side voltage applying unit 180, and the gate voltage Vg2 is applied to the gate terminal of the third MOSFET 161 and the gate terminal of the fourth MOSFET 162 such that the potential at the source terminal is equal to the potential at the gate terminal. Thus, the power supplied to the steering control device 30 is maintained by the main power source 50. The power source control unit 70 recognizes that there is no abnormality in the main power source 50, based on the input high-level second control voltage signal SC2 and the high-level first control voltage signal SC1 generated by the power source control unit.

Figure 3:
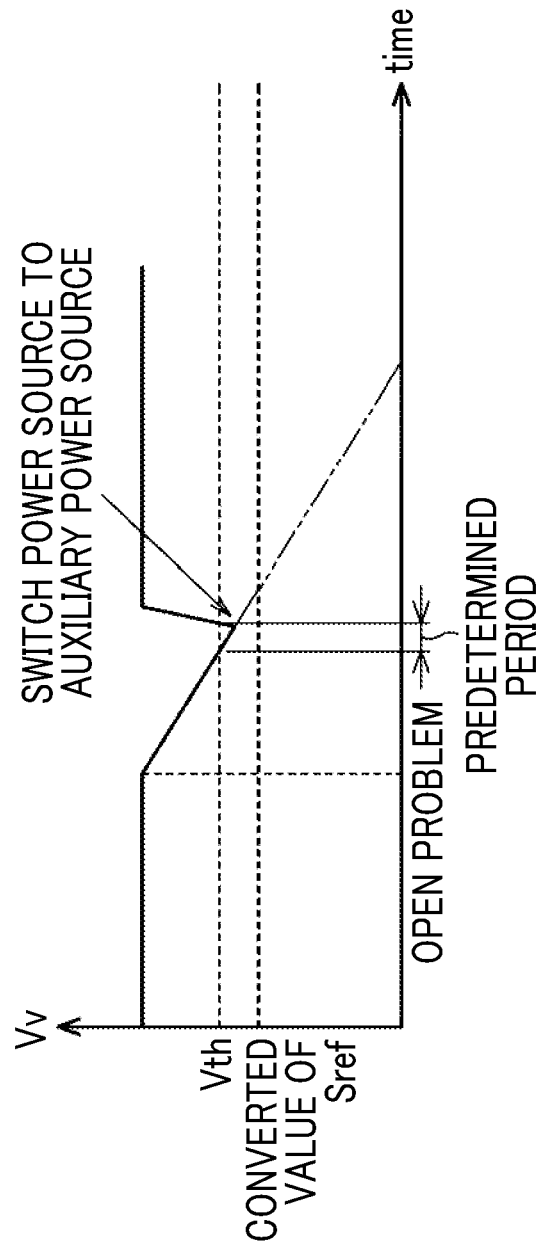
FIG. 3 is a graph illustrating transition of a power source voltage value in a case where an open problem occurs in a main power source.

As illustrated in FIGS. 2 and 3, in a case where the power source voltage value Vv of the main power source 50 slowly decreases, the divided voltage of the power source voltage signal Sv exceeds the voltage of the abnormality determination voltage signal Sref. However, a situation in which the power source voltage value Vv of the main power source 50 does not exceed the abnormality-determination-voltage threshold value Vth may occur. Since the pseudo abnormality signal Sa is not input from the power source control unit 70, the pseudo operation circuit 140 outputs the power source voltage signal Sv input from the connection point P3 to the voltage division circuit 130 through the source terminal and the drain terminal of the fifth MOSFET 143. The voltage division circuit 130 outputs the power source voltage signal Sv divided by the voltage division resistors 131 and 132 to the comparison circuit 120. Since the voltage of the power source voltage signal Sv divided by the voltage division circuit 130 exceeds the voltage of the abnormality determination voltage signal Sref, the comparison circuit 120 determines that there is no abnormality in the main power source 50 and outputs the second control voltage signal SC2 of a high level from the output terminal. In a case where the situation in which the power source voltage value Vv of the main power source 50, which is recognized using the voltage detection circuit 80 does not exceed the abnormality-determination-voltage threshold value Vth continues for a predetermined period, the power source control unit 70 determines that the abnormality occurs in the main power source 50 and generates the first control voltage signal SC1 of a low level. The first control voltage signal SC1 of a low level and the second control voltage signal SC2 of a high-level are input to the main power source-side voltage applying unit 170 and the auxiliary power source-side voltage applying unit 180. In a case where the first control voltage signal SC1 of a low level is input, the main power source-side voltage applying unit 170 applies the gate voltage Vg1 to the gate terminal of the first MOSFET 151 and the gate terminal of the second MOSFET 152 such that the potential at the source terminal is equal to the potential at the gate terminal. In a case where the first control voltage signal SC1 of a low level is input, the auxiliary power source-side voltage applying unit 180 applies the gate voltage Vg2 having a potential that is higher than the potential at the source terminal, to the gate terminal of the third MOSFET 161 and the gate terminal of the fourth MOSFET 162. Thus, the power source that supplies power to the steering control device 30 is switched to the auxiliary power source 60. The power source control unit 70 recognizes that the abnormality occurs in the main power source 50, based on the input high-level second control voltage signal SC2 and the low-level first control voltage signal SC1 generated by the power source control unit. The power source control unit 70 can recognize that an open problem of the main power source 50, in which the power source voltage value Vv of the main power source 50 decreases slowly, abnormality caused by deterioration of the main power source 50 with time, and the like among abnormalities of the main power source 50 has occurred.

Figure 4:
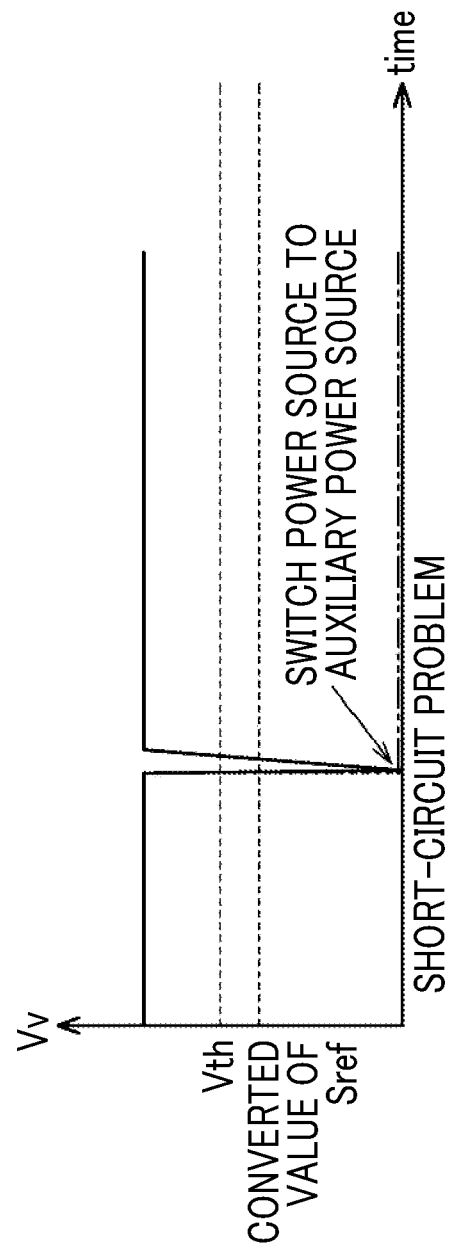
FIG. 4 is a graph illustrating the transition of the power source voltage value in a case where a short-circuit problem occurs in the main power source.

As illustrated in FIGS. 2 and 4, in a case where the power source voltage value Vv of the main power source 50 sharply decreases, a situation in which the divided voltage of the power source voltage signal Sv does not exceed the voltage of the abnormality determination voltage signal Sref, and the power source voltage value Vv of the main power source 50 does not exceed the abnormality-determination-voltage threshold value Vth may occur. The power source control unit 70 converts the power source voltage signal Sv that is an analog signal detected through the voltage detection circuit 80, into the power source voltage value Vv that is a digital value, and determines abnormality in the main power source 50 based on the power source voltage value Vv. The power source control unit 70 determines that there is no abnormality in the main power source 50 and generates the first control voltage signal SC1 of a high level, during a predetermined period in which a situation in which the power source voltage value Vv of the main power source 50 does not exceed the abnormality-determination-voltage threshold value Vth continues. Since the pseudo abnormality signal Sa is not input from the power source control unit 70, the pseudo operation circuit 140 outputs the power source voltage signal Sv input from the connection point P3 to the voltage division circuit 130 through the source terminal and the drain terminal of the fifth MOSFET 143. The voltage division circuit 130 outputs the power source voltage signal Sv divided by the voltage division resistors 131 and 132 to the comparison circuit 120. Since the voltage of the power source voltage signal Sv divided by the voltage division circuit 130 does not exceed the voltage of the abnormality determination voltage signal Sref, the comparison circuit 120 determines that the abnormality occurs in the main power source 50, and generates the second control voltage signal SC2 of a low level.

It is assumed that the determination of whether the abnormality occurs in the main power source 50 by the analog determination circuit 100 and the determination of whether the abnormality occurs in the main power source 50 by the power source control unit 70 are started at the same timing. The determination of whether the abnormality occurs in the main power source 50 by the power source control unit 70 is performed after a process of converting an analog signal to a digital value. However, the determination of whether the abnormality occurs in the main power source 50 by the analog determination circuit 100 is performed without performing the process of converting the analog signal to the digital value. Therefore, the determination of whether the abnormality occurs in the main power source 50 by the analog determination circuit 100 can be performed more quickly than the determination of whether the abnormality occurs in the main power source 50 by the power source control unit 70, by a period in which the process of converting the analog signal into the digital value is not performed. Thus, immediately after the abnormality in which the power source voltage value Vv of the main power source 50 sharply decreases has occurred, the low-level second control voltage signal SC2 is generated by the analog determination circuit 100, and the high-level first control voltage signal SC1 is generated by the power source control unit 70.

The high-level first control voltage signal SC1 from the power source control unit 70 and the low-level second control voltage signal SC2 from the analog determination circuit 100 are input to the main power source-side voltage applying unit 170 and the auxiliary power source-side voltage applying unit 180. In a case where the second control voltage signal SC2 of a low level is input, the main power source-side voltage applying unit 170 applies the gate voltage Vg1 to the gate terminal of the first MOSFET 151 and the gate terminal of the second MOSFET 152 such that the potential at the source terminal is equal to the potential at the gate terminal. As a result, the first MOSFET 151 and the second MOSFET 152 turn into the interruption state. In a case where the second control voltage signal SC2 of a low level is input, the auxiliary power source-side voltage applying unit 180 applies the gate voltage Vg2 having a potential that is higher than the potential at the source terminal, to the gate terminal of the third MOSFET 161 and the gate terminal of the fourth MOSFET 162. As a result, the third MOSFET 161 and the fourth MOSFET 162 turn into the conduction state. As described above, in a case where abnormality in which the power source voltage value Vv of the main power source 50 sharply decreases occurs, the analog determination circuit 100 can quickly generate a low-level control voltage for switching the power source that supplies power to the steering control device 30, to the auxiliary power source 60. Thus, it is possible to switch the power source quickly. The power source control unit 70 recognizes that the abnormality occurs in the main power source 50, based on the input low-level second control voltage signal SC2 and the high-level first control voltage signal SC1 generated by the power source control unit. The power source control unit 70 can recognize that the short-circuit problem of the main power source 50, in which the power source voltage value Vv of the main power source 50 sharply drops occurs among the abnormalities of the main power source 50.

As illustrated in FIG. 2, in a case where the operation of the analog determination circuit 100 is checked during an initial check at the start of the vehicle, the power source control unit 70 outputs the pseudo abnormality signal Sa for causing pseudo abnormality to occur in the power source voltage signal Sv input to the comparison circuit 120, to the pseudo operation circuit 140. As a result, the digital transistor 144 turns off, and the fifth MOSFET 143 turns into the interruption state. Since the fifth MOSFET 143 is in the interruption state, the divided power source voltage signal Sv is not input to the comparison circuit 120, and a simulated situation in which the power source voltage value Vv sharply decreases, such as an occurrence of a short-circuit problem is produced. Since the voltage input to the positive input terminal does not exceed the voltage of the abnormality determination voltage signal Sref, the comparison circuit 120 determines that the abnormality occurs in the main power source 50, and generates the second control voltage signal SC2 of a low level. In a case where the comparison circuit 120 generates the second control voltage signal SC2 of a low level as a result of outputting the pseudo abnormality signal Sa to the pseudo operation circuit 140, the power source control unit 70 determines that there is no abnormality in the analog determination circuit 100. In a case where the comparison circuit 120 does not generate the second control voltage signal SC2 of a low level regardless of the output of the pseudo abnormality signal Sa to the pseudo operation circuit 140, the power source control unit 70 determines that the abnormality occurs in the analog determination circuit 100. In a case where there is no abnormality in the analog determination circuit 100, the second control voltage signal SC2 of a low level is input to the main power source-side voltage applying unit 170 and the auxiliary power source-side voltage applying unit 180. The main power source-side voltage applying unit 170 and the auxiliary power source-side voltage applying unit 180 start an operation to switch the power source that supplies power to the steering control device 30, to the auxiliary power source 60 based on the second control voltage signal SC2 of a low level. However, in a case where the power source control unit 70 determines that there is no abnormality in the analog determination circuit 100, the power source control unit 70 outputs a reset signal for resetting the auxiliary power source device 40, such that the state returns to a state before the power source control unit 70 checks the operation of the analog determination circuit 100. That is, the power source that supplies power to the steering control device 30 is brought back to the main power source 50. In a case where the abnormality occurs in the analog determination circuit 100, the second control voltage signal SC2 of a high level is input to the main power source-side voltage applying unit 170 and the auxiliary power source-side voltage applying unit 180. In a case where the power source control unit 70 determines that the abnormality occurs in the analog determination circuit 100, the power source control unit 70 reports the occurrence of the abnormality by lighting a lamp, for example.

The effect in the embodiment will be described.

(1) In switching the power source, a step in which the analog determination circuit 100 determines the occurrence of the abnormality in the main power source 50 with the power source voltage signal Sv that is the analog signal indicating the output state of the main power source 50 and generates the second control voltage signal SC2 that is the analog signal indicating the determination result, and the power source switching circuit 110 switches the power source in accordance with the second control voltage signal SC2 may be performed. That is, the second control voltage signal SC2 as the analog signal can be generated without performing a process of converting the power source voltage signal Sv into the digital value. Thus, it is possible to simplify a step required for switching the power source in comparison to the step in a case where the switching signal is converted into a digital signal and then is used for determining switching of the power source. Therefore, even in a situation in which the voltage of the power output from the main power source 50 drops sharply, it is possible to more quickly switch the power source that supplies power to the steering control device 30, from the main power source 50 to the auxiliary power source 60.

(2) In the embodiment, the specific configuration of the analog determination circuit 100 is provided as described above. Since the comparison circuit 120 is used, the second control voltage signal SC2 can be generated with the power source voltage signal Sv without performing the process of converting the power source voltage signal Sv into a digital value.

(3) In the embodiment, the specific configuration of the power source switching circuit 110 is provided as described above. Since the second control voltage signal SC2 is input from the comparison circuit 120 to the main power source-side voltage applying unit 170 and the auxiliary power source-side voltage applying unit 180, it is possible to switch the power source that supplies power to the steering control device 30, from the main power source 50 to the auxiliary power source 60.

(4) The power source control unit 70 can detect the occurrence of the abnormality in the analog determination circuit 100 based on whether or not the comparison circuit 120 generates the second control voltage signal SC2 of a low level by outputting the pseudo abnormality signal Sa to the pseudo operation circuit 140 during an initial check. Thus, it is possible to recognize information regarding whether or not the abnormality occurs in the analog determination circuit 100, and thus to perform a countermeasure such as fail-safe for the occurrence of the abnormality in the analog determination circuit 100. Since switching of the power source is performed by the analog determination circuit 100 after a state where the analog determination circuit 100 checks that the abnormality does not occur, during the initial check, it is possible to improve reliability of the auxiliary power source device 40.

(5) Not only the analog determination circuit 100, but also the power source control unit 70 can determine whether the abnormality occurs in the main power source 50. Thus, it is possible to more appropriately switch the power source in response to the occurrence of abnormality having a different form, than in a case where only either the analog determination circuit or the power source control circuit performs determination.

(6) It is possible to distinguish a case where the occurrence of the abnormality in the main power source 50 is determined based on determination that the power source voltage value Vv of the main power source 50 does not exceed the voltage of the abnormality determination voltage signal Sref, from a case where the occurrence of the abnormality in the main power source 50 is determined based on determination that the power source voltage value Vv of the main power source 50 exceeds the voltage of the abnormality determination voltage signal Sref, but does not exceed the abnormality-determination-voltage threshold value Vth. Accordingly, it is possible to recognize the form of the abnormality occurring in the main power source 50.

The embodiment may be modified as follows. The other embodiments as follows can be combined with each other within a technically consistent range.

The first MOSFET 151, the second MOSFET 152, and the fifth MOSFET 143 may be N-channel MOSFETs. The third MOSFET 161 and the fourth MOSFET 162 may be P-channel MOSFETs.

The detection of the occurrence of the abnormality in the analog determination circuit 100 using the pseudo operation circuit 140 is not limited to the time during the initial check, and may be performed intermittently while the start switch is on.

The abnormality-determination-voltage threshold value Vth may be set to be equal to the potential of the voltage value obtained by converting the abnormality determination voltage signal Sref into a digital value, or may be set to a low potential.

The power source control unit 70 determines that the abnormality occurs in the main power source 50, based on whether or not the situation in which the power source voltage value Vv of the main power source 50 does not exceed the abnormality-determination-voltage threshold value Vth continues for a predetermined period. The condition of the predetermined period may not be provided. That is, in a case where the power source voltage value Vv of the main power source 50 does not exceed the abnormality-determination-voltage threshold value Vth, the power source control unit 70 may determine that the abnormality occurs in the main power source 50. In a case where the power source voltage value Vv of the main power source 50 exceeds the abnormality-determination-voltage threshold value Vth, the power source control unit 70 may determine that there is no abnormality in the main power source 50.

The power source control unit 70 may not recognize the form of the abnormality of the main power source 50 based on the second control voltage signal SC2 generated by the analog determination circuit 100. The second control voltage signal SC2 generated by the analog determination circuit 100 may be input to the power source control unit 70.

The power source control unit 70 may not have a function of determining whether the abnormality occurs in the main power source 50. That is, the determination of whether the abnormality occurs in the main power source 50 may be performed only by the analog determination circuit 100.

The specific configuration of the comparison circuit 120, the specific configuration of the voltage division circuit 130, and the specific configuration of the pseudo operation circuit 140 are not limited to those in the above-described embodiment. For example, a configuration for stabilizing the output, such as the pull-up resistor 122 of the comparison circuit 120 may be omitted. For example, the positive power source terminal and the negative power source terminal may be connected to each other by a connection line, and a component such as a capacitor for stabilizing the output of the comparison circuit 120 may be added to the connection line. That is, the specific configuration of the comparison circuit 120, the specific configuration of the voltage division circuit 130, and the specific configuration of the pseudo operation circuit 140 may be appropriately changed.

The power source voltage signal Sv indicating the voltage at the connection point P2 may be input to the pseudo operation circuit 140.

Figure 5:
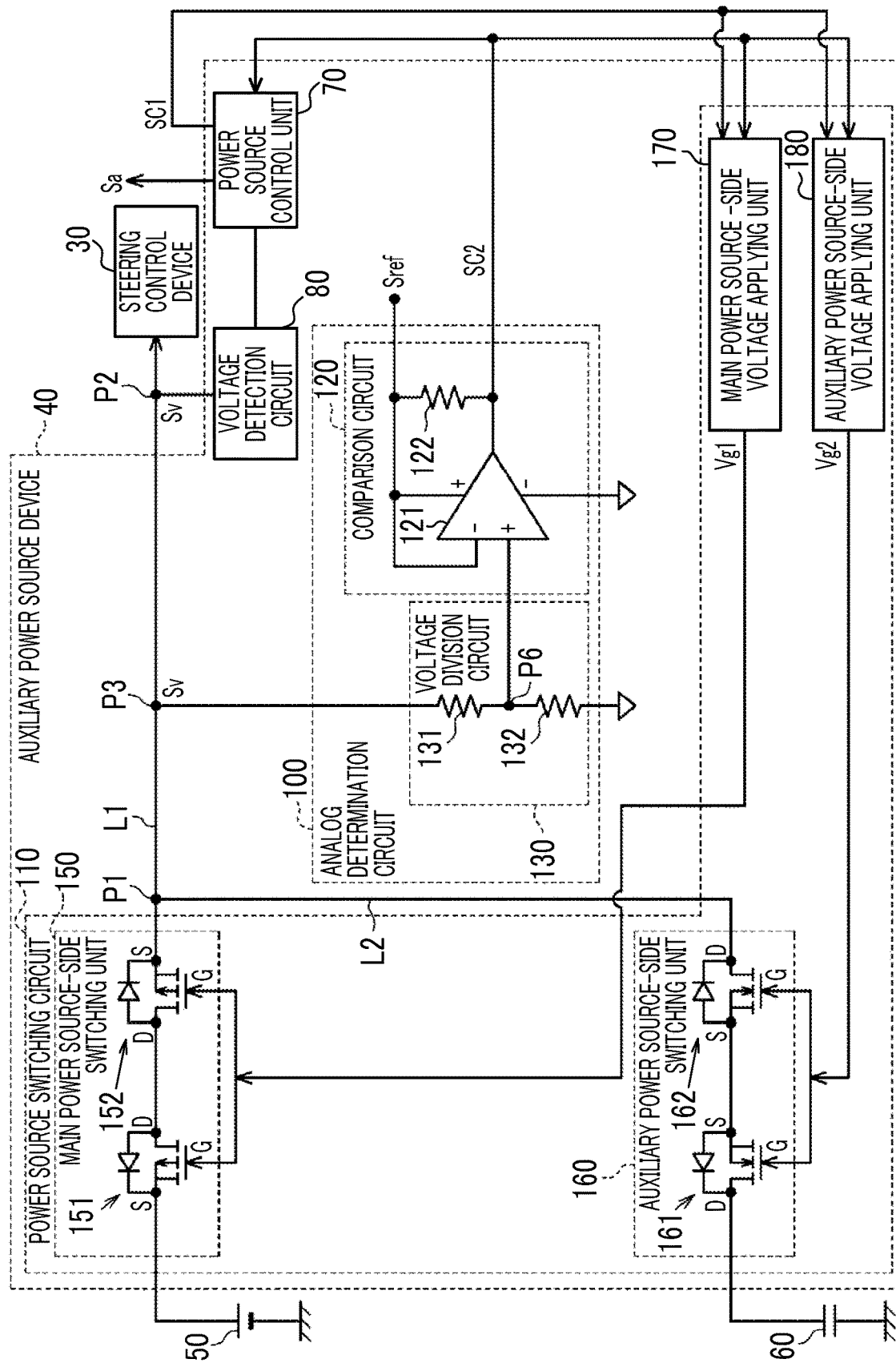
FIG. 5 is a diagram illustrating an electrical configuration of an auxiliary power source device according to another embodiment.

As illustrated in FIG. 5, the pseudo operation circuit 140 may not be provided in the analog determination circuit 100. In this case, the voltage division resistor 131 of the voltage division circuit 130 has the first end connected to the connection point P3 and the second end connected to the voltage division resistor 132. The power source control unit 70 may not have a function of outputting the pseudo abnormality signal S a.

The voltage division circuit 130 may not be provided in the analog determination circuit 100. In this case, the withstanding voltage performance of withstanding the voltage of the power source voltage signal Sv that is not divided is desired for the comparator 121 of the comparison circuit 120. The abnormality determination voltage signal Sref is set to have a voltage that is allowed to be compared with the power source voltage signal Sv that is not divided.

The comparison circuit 120 determines whether the abnormality occurs in the main power source 50, based on the voltage of the power source voltage signal Sv. The comparison circuit 120 may determine whether the abnormality occurs in the main power source 50, based on a signal indicating the current at the connection point P3. That is, comparison circuit 120 may determine whether the abnormality occurs in the main power source 50, based on an analog signal indicating the output state of the main power source 50.

The power source switching circuit 110 may be a mechanical switch that switches the power source connected to the connection point P1, between the main power source 50 and the auxiliary power source 60.

In the embodiment, the steering device 1 to which the auxiliary power source device 40 is applied is configured as an electric power steering device in which the motor 20 is connected to the steering shaft 12 through the speed reducer 21. The steering device may be configured as an electric power steering device in which the motor 20 is connected to the rack shaft 14 through the speed reducer 21. The steering device is not limited to the electric power steering device to which the auxiliary power source device 40 is applied. The auxiliary power source device 40 may be applied to a steer-by-wire steering device, for example.

The power supply target of the auxiliary power source device 40 may be an airbag device, a brake device, or the like. The power supply target may be a control device for an automatic guided vehicle, an electric vehicle, or the like.

What is claimed is:

1. An auxiliary power source device comprising:
a main power source-side path that is a power supply path from a main power source to a power supply target;
an auxiliary power source-side path that is connected to the main power source-side path, the auxiliary power source-side path being a power supply path from an auxiliary power source to the power supply target, and the auxiliary power source being connected to the power supply target through the auxiliary power source-side path;
a power source control circuit that is configured to control switching between a conduction state and an interruption state on the main power source-side path and to control switching between a conduction state and an interruption state on the auxiliary power source-side path;
an analog determination circuit that is provided separately from the power source control circuit, the analog determination circuit being configured to:
determine an occurrence of voltage reduction in the main power source with an analog signal indicating an output state of the main power source; and
generate a switching signal that is an analog signal indicating the occurrence of the voltage reduction in the main power source when the analog determination circuit determines the occurrence of the voltage reduction in the main power source; and a power source switching circuit that is configured to switch a power source for supplying power to the power supply target, from the main power source to the auxiliary power source based on the switching signal generated by the analog determination circuit.

2. The auxiliary power source device according to claim 1, wherein the analog determination circuit includes a comparison circuit to which a power source voltage signal as the analog signal indicating the output state of the main power source and a voltage reduction determination voltage signal depending on a voltage reduction determination voltage are input, the power source voltage signal indicating a power source voltage of the main power source, and the voltage reduction determination voltage indicating that voltage reduction occurs in the main power source, the comparison circuit is configured to, in a case where a voltage of the power source voltage signal exceeds a voltage of the voltage reduction determination voltage signal, determine that the voltage reduction does not occur in the main power source and to generate the switching signal in which the main power source is set as a power source for supplying power to the power supply target, and the comparison circuit is configured to, in a case where the voltage of the power source voltage signal does not exceed the voltage of the voltage reduction determination voltage signal, determine that the voltage reduction occurs in the main power source and to generate the switching signal in which the auxiliary power source is set as the power source for supplying power to the power supply target.

3. The auxiliary power source device according to claim 2, wherein the power source switching circuit includes a main power source-side switching circuit that is provided on the main power source-side path, an auxiliary power source-side switching circuit that is provided on the auxiliary power source-side path, a main power source-side voltage applying circuit, and an auxiliary power source-side voltage applying circuit, the main power source-side switching circuit includes first metal-oxide-semiconductor field-effect-transistors that perform switching between the conduction state and the interruption state, the auxiliary power source-side switching circuit includes second metal-oxide-semiconductor field-effect-transistors that perform switching between the conduction state and the interruption state, the main power source-side voltage applying circuit is configured to apply a gate voltage for performing switching between the conduction state and the interruption state to a gate terminal of the main power source-side switching circuit, the auxiliary power source-side voltage applying circuit is configured to apply a gate voltage for performing switching between the conduction state and the interruption state to a gate terminal of the auxiliary power source-side switching circuit, the power source control circuit and the comparison circuit are configured to control the switching of the main power source-side switching circuit between the conduction state and the interruption state by outputting a control voltage signal to the main power source-side voltage applying circuit, and the power source control circuit and the comparison circuit are configured to control the switching of the auxiliary power source-side switching circuit between the conduction state and the interruption state by outputting a control voltage signal to the auxiliary power source-side voltage applying circuit, the comparison circuit is configured to, in a case where the voltage of the power source voltage signal exceeds the voltage of the voltage reduction determination voltage signal, output a control voltage signal for causing the main power source-side switching circuit to be in the conduction state, as the switching signal, to the main power source-side voltage applying circuit and output a control voltage signal for causing the auxiliary power source-side switching circuit to be in the interruption state, as the switching signal, to the auxiliary power source-side voltage applying circuit, and the comparison circuit is configured to, in a case where the voltage of the power source voltage signal does not exceed the voltage of the voltage reduction determination voltage signal, output a control voltage signal for causing the main power source-side switching circuit to turn into the interruption state, as the switching signal, to the main power source-side voltage applying circuit and output a control voltage signal for causing the auxiliary power source-side switching circuit to turn into the conduction state, as the switching signal, to the auxiliary power source-side voltage applying circuit.

4. The auxiliary power source device according to claim 2, wherein the analog determination circuit includes a pseudo operation circuit that causes pseudo voltage reduction to occur in the power source voltage signal input to the comparison circuit based on an input of a pseudo voltage reduction signal from the power source control circuit, the power source control circuit is configured to, in a case where an operation of the analog determination circuit is checked, output the pseudo voltage reduction signal for causing pseudo voltage reduction to occur in the power source voltage signal input to the comparison circuit, to the pseudo operation circuit, the power source control circuit is configured to, in a case where the comparison circuit generates the switching signal as a result of outputting the pseudo voltage reduction signal to the pseudo operation circuit, determine that the voltage reduction does not occur in the analog determination circuit, and the power source control circuit is configured to, in a case where the comparison circuit does not generate the switching signal regardless of the output of the pseudo voltage reduction signal to the pseudo operation circuit, determine that the voltage reduction occurs in the analog determination circuit.

5. The auxiliary power source device according to claim 2, wherein the power source control circuit stores an voltage reduction-determination-voltage threshold value for indicating that the voltage reduction occurs in the main power source, as a digital value, the power source control circuit is configured to acquire the power source voltage signal and to convert the acquired power source voltage signal into a power source voltage value that is a digital value, the power source control circuit is configured to, in a case where the power source voltage value exceeds the voltage reduction-determination-voltage threshold value, output an analog signal for setting the main power source as the power source for supplying power to the power supply target, to the power source switching circuit, and the power source control circuit is configured to, in a case where the power source voltage value does not exceed the voltage reduction-determination-voltage threshold value, output an analog signal for setting the auxiliary power source as the power source for supplying power to the power supply target, to the power source switching circuit.

6. The auxiliary power source device according to claim 5, wherein the voltage reduction-determination-voltage threshold value is set to have a potential that is higher than a voltage value obtained by converting the voltage reduction determination voltage signal into a digital value.

* * * * *